(12) United States Patent
Wang

(10) Patent No.: US 11,937,489 B2
(45) Date of Patent: Mar. 19, 2024

(54) WATER ABSORPTION LAYER MOUNTED ON LIGHT EMITTING LAYER FOR ARRAY SUBSTRATE

(71) Applicant: WUHAN CHINA STAR OPTOELECTRONICS SEMICONDUCTOR DISPLAY TECHNOLOGY CO., LTD., Wuhan (CN)

(72) Inventor: Gaozhen Wang, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 934 days.

(21) Appl. No.: 16/959,108

(22) PCT Filed: Apr. 10, 2020

(86) PCT No.: PCT/CN2020/084258
§ 371 (c)(1),
(2) Date: Jun. 29, 2020

(87) PCT Pub. No.: WO2021/189555
PCT Pub. Date: Sep. 30, 2021

(65) Prior Publication Data
US 2023/0157137 A1    May 18, 2023

(30) Foreign Application Priority Data
Mar. 26, 2020  (CN) .......................... 202010222095.7

(51) Int. Cl.
H10K 59/80       (2023.01)
H01L 27/146      (2006.01)
(Continued)

(52) U.S. Cl.
CPC ....... H10K 59/874 (2023.02); H01L 27/1463 (2013.01); H10K 50/84 (2023.02);
(Continued)

(58) Field of Classification Search
CPC ............. H10K 59/874; H10K 59/1201; H10K 59/122; H10K 59/873; H10K 50/84; H10K 59/8052; H10K 50/82; H01L 27/1463
See application file for complete search history.

(56) References Cited

U.S. PATENT DOCUMENTS

2010/0171138 A1* 7/2010 Yamazaki .............. H05B 33/12
                                                    257/98
2013/0248867 A1* 9/2013 Kim ..................... H10K 50/844
                                                    438/34
(Continued)

FOREIGN PATENT DOCUMENTS

CN         1395449 A      2/2003
CN       103972267 A      8/2014
(Continued)

OTHER PUBLICATIONS

International Search Report in International application No. PCT/CN2020/084258, dated Dec. 31, 2020.
(Continued)

*Primary Examiner* — Alonzo Chambliss
(74) *Attorney, Agent, or Firm* — PV IP PC; Wei Te Chung; Zhigang Ma

(57) ABSTRACT

The present application provides a display panel and a manufacturing method thereof. The display panel includes an array substrate, a light emitting layer, and a water and oxygen adsorption layer. The light emitting layer is disposed on the array substrate. The light emitting layer includes a pixel definition structure and a plurality of light emitting
(Continued)

parts, the pixel definition structure includes a plurality of grooves, and the light emitting parts are disposed in the grooves. The water and oxygen adsorption layer includes a plurality of water and oxygen adsorption parts, the water and oxygen adsorption parts are disposed on the pixel definition structure, and a surface of the water and oxygen adsorption parts is convex.

13 Claims, 5 Drawing Sheets

(51) Int. Cl.
    *H10K 50/84*     (2023.01)
    *H10K 59/12*     (2023.01)
    *H10K 59/122*     (2023.01)

(52) U.S. Cl.
    CPC ....... *H10K 59/1201* (2023.02); *H10K 59/122* (2023.02); *H10K 59/8052* (2023.02); *H10K 59/873* (2023.02)

(56) References Cited

U.S. PATENT DOCUMENTS

| | | |
|---|---|---|
| 2014/0103308 A1 | 4/2014 | Choi et al. |
| 2014/0145585 A1 | 5/2014 | Choi et al. |
| 2014/0353595 A1* | 12/2014 | Choi ............... H10K 59/00 257/40 |
| 2015/0090991 A1 | 4/2015 | Ishii et al. |
| 2015/0357602 A1* | 12/2015 | Li ............... H10K 50/865 257/40 |

FOREIGN PATENT DOCUMENTS

| | | | |
|---|---|---|---|
| CN | 104979375 A | 10/2015 | |
| CN | 105826357 A | 8/2016 | |
| CN | 109427846 A | 3/2019 | |
| CN | 109638059 A | 4/2019 | |
| EP | 2811522 A2 * | 12/2014 | ............. H01L 27/32 |
| JP | 2008300169 A | 12/2008 | |
| TW | 201031258 A | 8/2010 | |

OTHER PUBLICATIONS

Written Opinion of the International Searching Authority in International application No. PCT/CN2020/084258, dated Dec. 31, 2020.

Chinese Office Action issued in corresponding Chinese Patent Application No. 202010126859.2 dated Oct. 27, 2020, pp. 1-8.

* cited by examiner

WATER ABSORPTION LAYER MOUNTED ON LIGHT EMITTING LAYER FOR ARRAY SUBSTRATE

RELATED APPLICATIONS

This application is a Notional Phase of PCT Patent Application No. PCT/CN2020/084258 having international filing date of Apr. 10, 2020, which claims the benefit of priority of Chinese Patent Application No. 202010222095.7 filed on Mar. 26, 2020. The contents of the above applications are all incorporated by reference as if fully set forth herein in their entirety.

FIELD OF INVENTION

The present application relates to the field of display, and specifically to a display panel and a manufacturing method thereof.

BACKGROUND OF INVENTION

Currently, organic light-emitting diode (OLED) display devices commonly use properties of organic light-emitting materials. Under a situation of applying an external electric field, holes and electrons produced recombine and release energy in an organic light-emitting material layer, thereby making the organic material emit light. However, because this kind of organic light-emitting materials are easily eroded by water and oxygen, the organic materials are damaged such that a light-emitting lifetime is affected. Meanwhile, total internal reflection that occurs in a display panel leads to a decreased light-emitting efficiency, and a lifetime of the display panel and the light-emitting efficiency are further affected.

SUMMARY OF INVENTION

The present application provides a display panel and a manufacturing method thereof to increase a lifetime of the display panel and the light-emitting efficiency.

The present application provides a display panel that includes: an array substrate; a light emitting layer disposed on the array substrate, wherein the light emitting layer includes a pixel definition structure, a plurality of light emitting parts, and a cathode, the cathode is disposed on the array substrate, the pixel definition structure includes a plurality of grooves, the grooves penetrate through the pixel definition structure to expose the cathode, the light emitting parts are disposed in the grooves, and the light emitting parts are electrically connected to the array substrate; and a water and oxygen adsorption layer comprising a plurality of water and oxygen adsorption parts, wherein the water and oxygen adsorption parts are disposed on the pixel definition structure, and a surface of the water and oxygen adsorption parts is convex.

In the display panel according to the present application, the display panel includes a display area and a non-display area surrounding the display area, the pixel definition structure includes a first part and a second part, the first part is located at the display area, the second part is located at the non-display area, the light emitting parts are located at the display area, and the water and oxygen adsorption parts are located on the second part.

In the display panel according to the present application, the display panel includes a display area and a non-display area surrounding the display area, the pixel definition structure includes a first part and a second part, the first part is located at the display area, the second part is located at the non-display area, the light emitting parts are located at the display area, and the water and oxygen adsorption parts are located on the first part.

In the display panel according to the present application, the display panel includes a display area and a non-display area surrounding the display area, the pixel definition structure includes a first part and a second part, the first part is located at the display area, the second part is located at the non-display area, the light emitting parts are located at the display area, and the water and oxygen adsorption parts are located on the first part and on the second part.

In the display panel according to the present application, a diameter of the water and oxygen adsorption parts located at the first part is less than a diameter of the water and oxygen adsorption parts located at the second part.

In the display panel according to the present application, the display panel includes an encapsulation layer, the encapsulation layer is disposed on the water and oxygen adsorption layer and covers the pixel definition structure, the light emitting parts, and the water and oxygen adsorption parts.

In the display panel according to the present application, a material of the water and oxygen adsorption parts includes one or more of polyacrylate, polyvinyl alcohol, polyoxy alkane, polyurethane, acrylate, or casein.

In the display panel according to the present application, a shape of the water and oxygen adsorption parts is hemispherical.

The present application further provides a display panel that includes: an array substrate; a light emitting layer disposed on the array substrate, wherein the light emitting layer includes a pixel definition structure and a plurality of light emitting parts, the pixel definition structure includes a plurality of grooves, the light emitting parts are disposed in the grooves, and the light emitting parts are electrically connected to the array substrate; and a water and oxygen adsorption layer comprising a plurality of water and oxygen adsorption parts, wherein the water and oxygen adsorption parts are disposed on the pixel definition structure of the light emitting layer, and a surface of the water and oxygen adsorption parts is convex.

In the display panel according to the present application, the display panel includes a display area and a non-display area surrounding the display area, the pixel definition structure includes a first part and a second part, the first part is located at the display area, the second part is located at the non-display area, the light emitting parts are located at the display area, and the water and oxygen adsorption parts are located on the second part.

In the display panel according to the present application, the display panel includes a display area and a non-display area surrounding the display area, the pixel definition structure includes a first part and a second part, the first part is located at the display area, the second part is located at the non-display area, the light emitting parts are located at the display area, and the water and oxygen adsorption parts are located on the first part.

In the display panel according to the present application, the display panel includes a display area and a non-display area surrounding the display area, the pixel definition structure includes a first part and a second part, the first part is located at the display area, the second part is located at the non-display area, the light emitting parts are located at the display area, and the water and oxygen adsorption parts are located on the first part and on the second part.

In the display panel according to the present application, a diameter of the water and oxygen adsorption parts located at the first part is less than a diameter of the water and oxygen adsorption parts located at the second part.

In the display panel according to the present application, the display panel includes an encapsulation layer, the encapsulation layer is disposed on the water and oxygen adsorption layer and covers the pixel definition structure, the light emitting parts, and the water and oxygen adsorption parts.

In the display panel according to the present application, a material of the water and oxygen adsorption parts includes one or more of polyacrylate, polyvinyl alcohol, polyoxy alkane, polyurethane, acrylate, or casein.

In the display panel according to the present application, a shape of the water and oxygen adsorption parts is hemispherical.

The present application further provides a manufacturing method of a display panel that includes: providing an array substrate; forming a light emitting layer on the array substrate, wherein the light emitting layer includes a pixel definition structure and a plurality of light emitting parts, the pixel definition structure includes a plurality of grooves, the light emitting parts are disposed in the grooves, and the light emitting parts are electrically connected to the array substrate; and forming a water and oxygen adsorption layer on the light emitting layer, wherein the water and oxygen adsorption layer includes a plurality of water and oxygen adsorption parts, the water and oxygen adsorption parts are disposed on the pixel definition structure, and a surface of the water and oxygen adsorption parts is convex.

In the manufacturing method of a display panel according to the present application, a shape of the water and oxygen adsorption parts is hemispherical.

In the manufacturing method of a display panel according to the present application, the display panel includes a display area and a non-display area surrounding the display area, the pixel definition structure includes a first part and a second part, the first part is located at the display area, the second part is located at the non-display area, the light emitting parts are located at the display area, and the water and oxygen adsorption parts are located on the second part.

In the manufacturing method of a display panel according to the present application, a diameter of the water and oxygen adsorption parts located at the first part is less than a diameter of the water and oxygen adsorption parts located at the second part.

The present application provides a display panel and a manufacturing method thereof. The display panel includes an array substrate, a light emitting layer, and a water and oxygen adsorption layer. The light emitting layer is disposed on the array substrate. The light emitting layer includes a pixel definition structure and a plurality of light emitting parts, the pixel definition structure includes a plurality of grooves, the light emitting parts are disposed in the grooves, and the light emitting parts are electrically connected to the array substrate. The water and oxygen adsorption layer includes a plurality of water and oxygen adsorption parts, the water and oxygen adsorption parts are disposed on the pixel definition structure, and a surface of the water and oxygen adsorption parts is convex. In the present application, the water and oxygen adsorption parts are disposed on the pixel definition structure, the water and oxygen adsorption parts are configured as a convex surface that can adsorb water and oxygen, and a lifetime of the display panel and the light-emitting efficiency are increased.

DESCRIPTION OF DRAWINGS

With reference to the following drawings, the technical approach and other beneficial effects of the present application will be obvious through describing embodiments of the present application in detail.

DETAILED DESCRIPTION OF PREFERRED EMBODIMENTS

Figure 1:
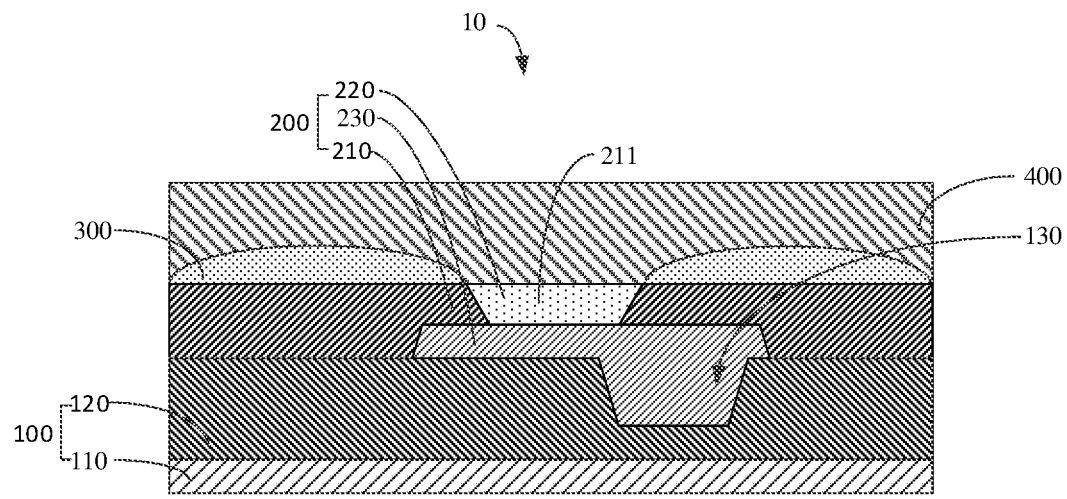
FIG. 1 is a sectional view of a display panel according to the present application.

Referring to FIG. 1, FIG. 1 is a sectional view of a display panel according to the present application. The present application provides a display panel 10, and the display panel 10 includes an array substrate 100, a light emitting layer 200, and a water and oxygen adsorption layer 300.

Figure 2:
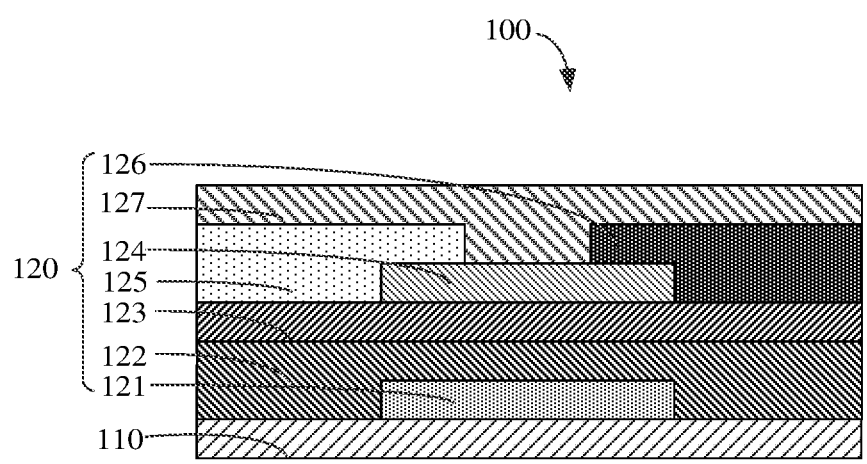
FIG. 2 is a sectional view of an array substrate according to the present application.

Referring to FIG. 2, FIG. 2 is a sectional view of an array substrate according to the present application. Specifically, the array substrate 100 includes a flexible substrate 110 and a thin film transistor layer 120. A material of the flexible substrate 110 is polyimide. The thin film transistor layer 120 is disposed on the flexible substrate 110. The thin film transistor layer 120 includes a gate 121, a first protection layer 122, a gate insulating layer 123, an active layer 124, a source 125, a drain 126, and a second protection layer 127. The gate 121 is disposed on the flexible substrate 110. A material of the gate 121 includes one or more of Mo, Al, Ti, In, and Ga. The first protection layer 122 covers the gate 121. The gate insulating layer 123 is disposed on the first protection layer 122. A material of the gate insulating layer 123 includes one or more of $Al_2O_3$, $SiOx$, and $SiN_x$. The active layer 124 is disposed on the gate insulating layer 123. A material of the active layer 124 includes amorphous silicon. The source 125 is disposed on the gate insulating layer 123 and at one end of the active layer 124. The drain 126 is disposed on the gate insulating layer 123 and at the other end of the active layer 124. The source 125 is insulated from the drain 126. The second protection layer 127 covers the source 125, the drain 126, and the active layer 124. The second protection layer 127 is configured to protect a structure of the thin film transistor layer 120 to prevent other structures or water and oxygen from affecting structures of the thin film transistor layer 120. The thin film transistor layer 120 further includes other structures in addition to the structures shown in FIG. 2, and description of those structures of the thin film transistor layer 120 is omitted here.

The array substrate 100 further includes a placement trough 130. The placement trough 130 is formed in the thin film transistor layer 120.

The light emitting layer 200 is disposed on the thin film transistor layer 120. The light emitting layer 200 includes a pixel definition structure 210, a plurality of light emitting parts 220, and a cathode 230. The cathode 230 is electrically connected to the array substrate 100 through being disposed in the placement trough 130. The pixel definition structure 210 is disposed on the array substrate 100 and on the cathode 230. The pixel definition structure 210 includes a plurality of grooves 211. The grooves 211 penetrate through the pixel definition structure 210 to expose the cathode 230. The light emitting parts 220 are disposed in the grooves 211.

Figure 3:
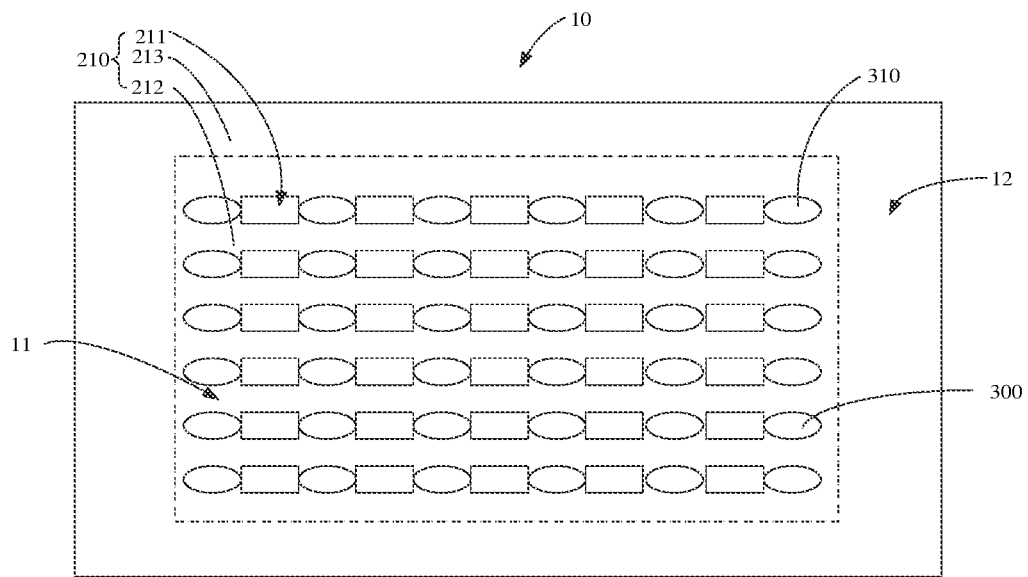
FIG. 3 is a first top view of a display panel according to the present application.

FIG. 3 is a first top view of a display panel according to the present application. Furthermore, the display panel 10 includes a display area 11 and a non-display area 12 surrounding the display area 11. The pixel definition structure 210 includes a first part 212 and a second part 213. The first part 212 is located at the display area 11. The second part 213 is located at the non-display area 12. A water and oxygen adsorption part 310 is disposed on the first part 212. The water and oxygen adsorption part 310 is located at a periphery of the grooves 211. A surface of the water and oxygen adsorption part 310 is convex. A material of the water and oxygen adsorption part 310 includes one or more of polyacrylate, polyvinyl alcohol, polyoxy alkane, polyurethane, acrylate, and casein.

In one embodiment, a shape of the water and oxygen adsorption part 310 is hemispherical.

Referring again to FIG. 1, the display panel 10 further includes an encapsulation layer 400. The encapsulation layer 400 is disposed on the water and oxygen adsorption layer 300. The encapsulation layer 400 covers the pixel definition structure 210, the light emitting parts 220, and the water and oxygen adsorption part 310.

Figure 4:
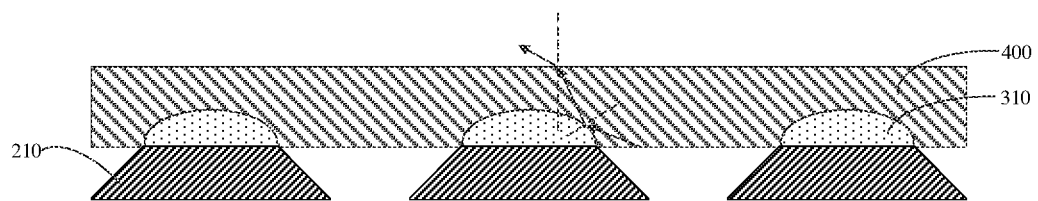
FIG. 4 is a light path diagram of a water and oxygen adsorption layer according to the present application.

Referring to FIG. 4, FIG. 4 is a light path diagram of a water and oxygen adsorption layer according to the present application. In the present application, the water and oxygen adsorption part 310 is disposed on the pixel definition structure 210, and the water and oxygen adsorption part 310 can adsorb and lock water and oxygen entering the encapsulation layer, prevent the water and oxygen from eroding the light emitting layer, and increase a lifetime of the display panel. Furthermore, a surface of the water and oxygen adsorption part 310 is configured as convex, and hence a problem that light cannot penetrate a screen to be seen by human eyes because a refractive index of a material of an encapsulation layer is less than that of air is prevented. In the present application, the water and oxygen adsorption part is configured as convex, light emitted by the light emitting parts will reflect at the convex surface, which changes an incidence angle of the light, and therefore the light penetrates the encapsulation layer and light-emitting efficiency is increased.

Figure 5:
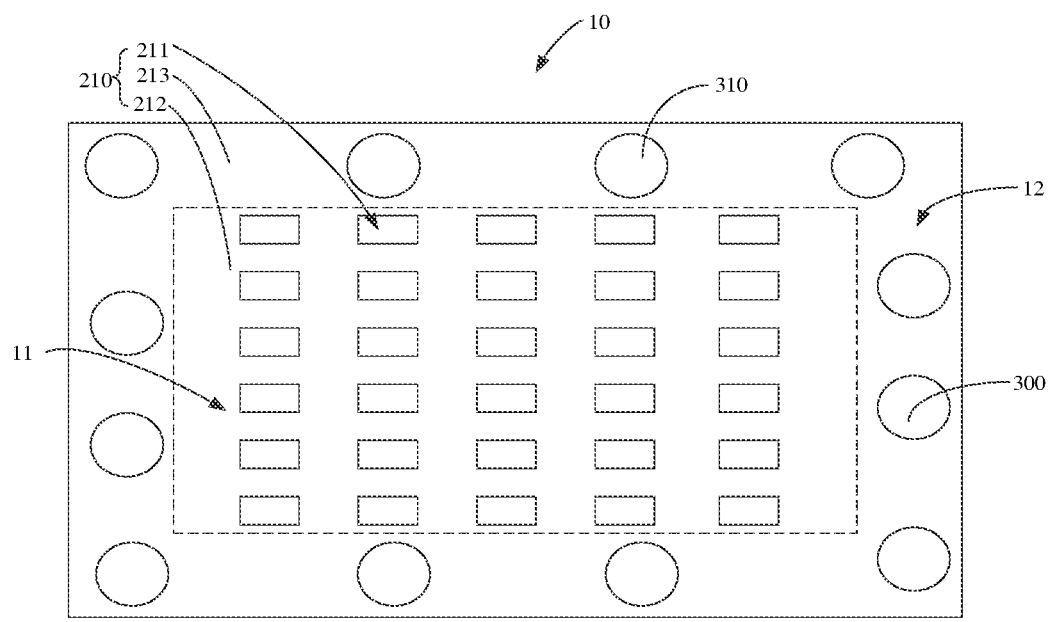
FIG. 5 is a second top view of a display panel according to the present application.

Referring to FIG. 5, FIG. 5 is a second top view of a display panel according to the present application. The water and oxygen adsorption part 310 is disposed on the second part 213.

Figure 6:
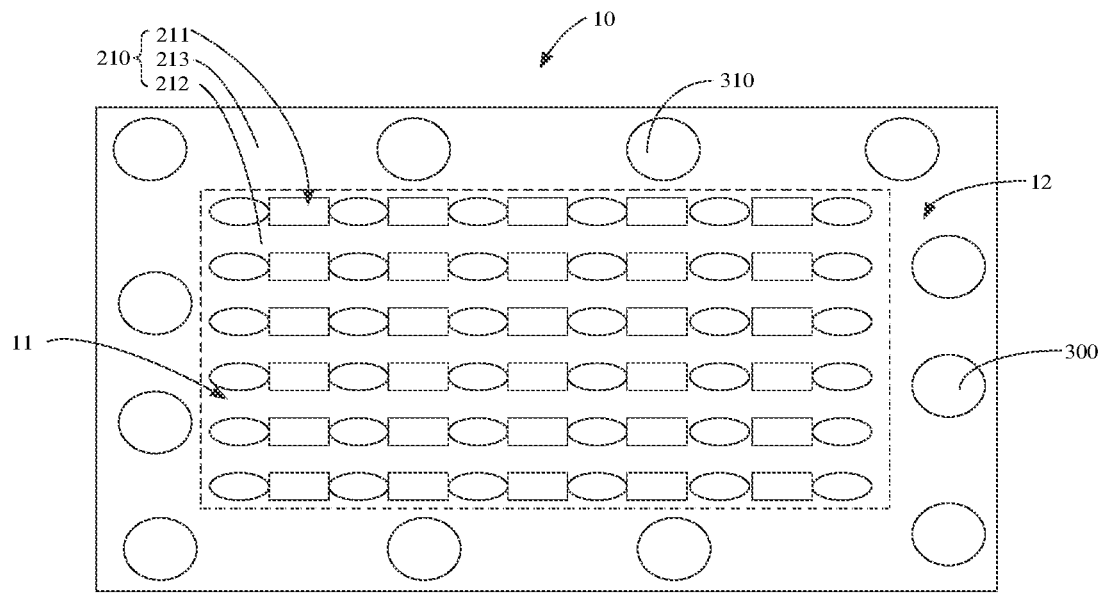
FIG. 6 is a third top view of a display panel according to the present application.

Referring to FIG. 6, FIG. 6 is a third top view of a display panel according to the present application. The water and oxygen adsorption part 310 is disposed on the first part 212 as well as on the second part 213. A diameter of the water and oxygen adsorption part 310 located on the first part 212 is less than that of the water and oxygen adsorption part 310 located on the second part 213.

The water and oxygen adsorption layer is disposed on the pixel definition structure in the display area and the non-display area, adsorbs and locks water and oxygen entering the encapsulation layer, prevents the water and oxygen from eroding the light emitting parts, and increases a lifetime of the display panel. If an incidence angle of light is excessively wide, and a refractive index of a material of an encapsulation layer is greater than that of air, the light will occur total internal reflection at an interface of the encapsulation layer such that the light cannot penetrate a screen to be seen by human eyes. In the present application, the water and oxygen adsorption layer is configured as convex, light emitted by the light emitting parts will reflect at the convex surface, which changes an incidence angle of the light, and therefore the light penetrates the encapsulation layer and light-emitting efficiency is increased.

Figure 7:
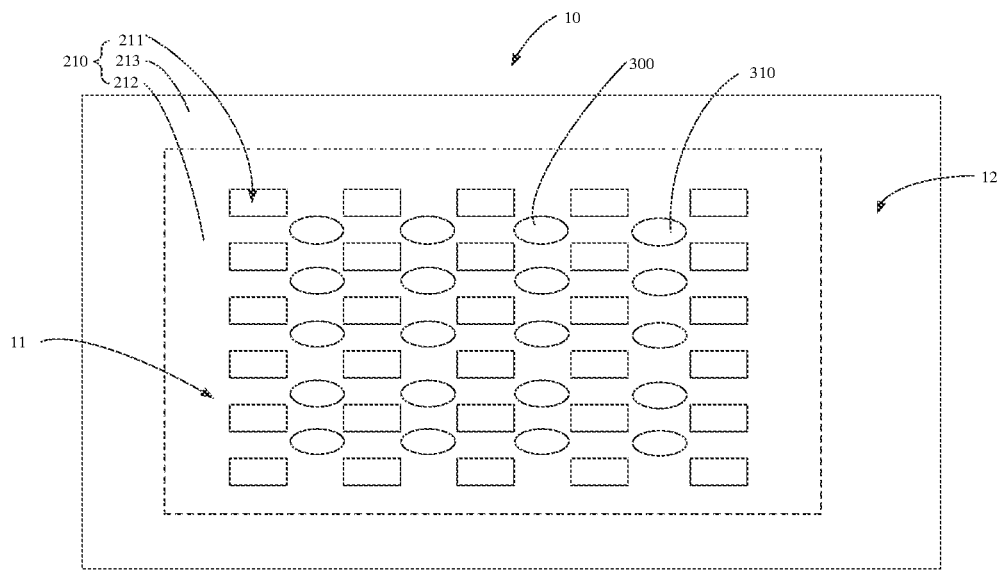
FIG. 7 is a fourth top view of a display panel according to the present application.

Referring to FIG. 7, FIG. 7 is a fourth top view of a display panel according to the present application. The water and oxygen adsorption part 310 is disposed at areas between adjacent columns and adjacent rows of grooves 211, therefore the water and oxygen adsorption part 310 does not easily fall into the grooves 211, the water and oxygen adsorption part 310 can be prepared rapidly, and production cost is further decreased.

Figure 8:
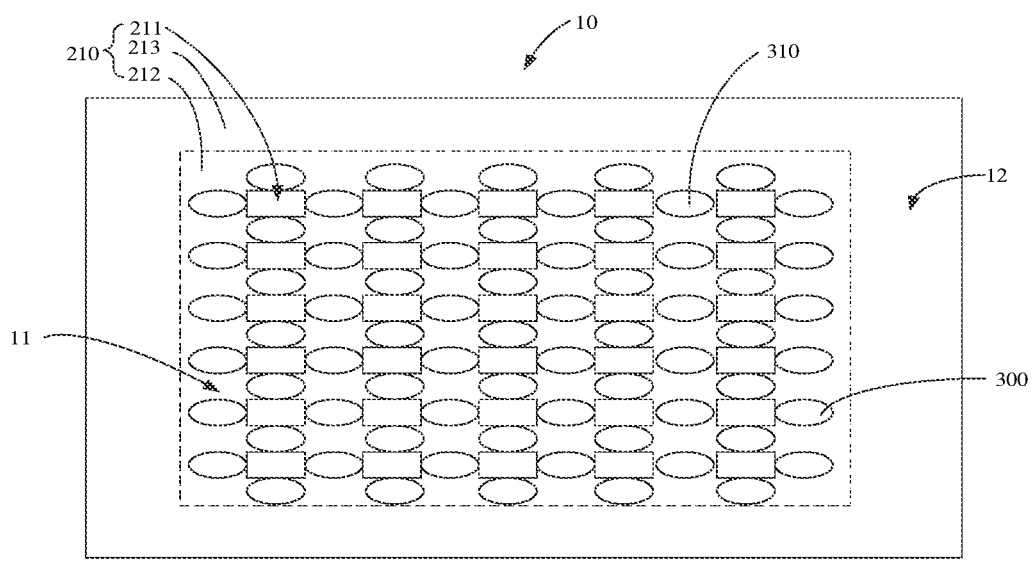
FIG. 8 is a fifth top view of a display panel according to the present application.

Referring to FIG. 8, FIG. 8 is a fifth top view of a display panel according to the present application. The water and oxygen adsorption part 310 is disposed not only at gaps of columns of the grooves 211, but also at gaps of rows of the grooves 211, and thereby water and oxygen adsorption effect of the display panel is increased, and performance of the display panel is further ensured.

In the present application, the water and oxygen adsorption layer is disposed on the pixel definition structure, adsorbs and locks water and oxygen entering the encapsulation layer, prevents the water and oxygen from eroding the light emitting parts, and increases a lifetime of the display panel. Meanwhile, the water and oxygen adsorption part is configured as convex, light emitted by the light emitting parts will reflect at the convex surface, which changes an incidence angle of the light, and therefore the light penetrates the encapsulation layer and light-emitting efficiency is increased.

Figure 9:
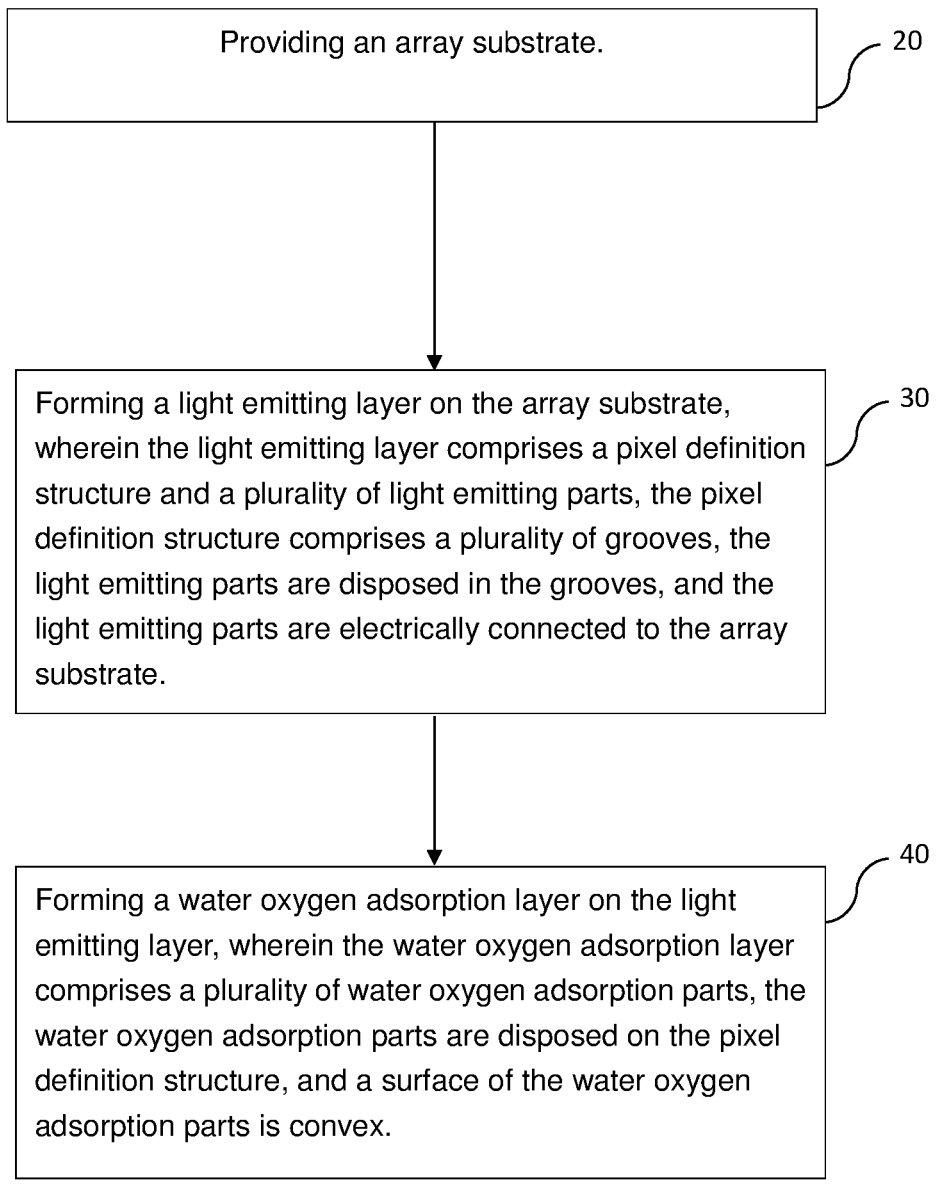
FIG. 9 is a flowchart of a manufacturing method of a display panel according to the present application.

Referring to FIG. 9, FIG. 9 is a flowchart of a manufacturing method of a display panel according to the present application. The present application further provides a manufacturing method of a display panel 10 that includes:

20, providing an array substrate 100.

Providing a flexible substrate 110. A material of the flexible substrate 110 is polyimide.

Forming a thin film transistor layer 120 on the flexible substrate 110. The thin film transistor layer 120 includes a gate 121, a first protection layer 122, a gate insulating layer 123, an active layer 124, a source 125, a drain 126, and a second protection layer 127. The first protection layer 122 covers the gate 121. The gate 121 is disposed on the flexible substrate 110. A material of the gate 121 includes one or more of Mo, Al, Ti, In, and Ga. The gate insulating layer 123 is disposed on the first protection layer 122. A material of the gate insulating layer 123 includes one or more of $Al_2O_3$, SiOx, and $SiN_x$. The active layer 124 is disposed on the gate insulating layer 123. A material of the active layer 124 includes amorphous silicon. The source 125 is disposed at one end of the gate insulating layer 123 and at one end of the active layer 124. The drain 126 is disposed at the other end of the gate insulating layer 123 and at the other end of the active layer 124. The source 125 is insulated from the drain 126. The second protection layer 127 covers the source 125, the drain 126, and the active layer 124. The second protection layer 127 is configured to protect a structure of the thin film transistor layer 120 to prevent other structures or water and oxygen from affecting structures of the thin film transistor layer 120. The thin film transistor layer 120 further includes other structures in addition to the structures shown in FIG. 2, and description of those structures of the thin film transistor layer 120 is omitted here.

In another embodiment, etching the array substrate 100 to form a placement trough 130.

30, forming a light emitting layer 200 on the array substrate 100, wherein the light emitting layer 200 includes a pixel definition structure 210 and a plurality of light emitting parts 220, the pixel definition structure 210 includes a plurality of grooves 211, the light emitting parts 220 are disposed in the grooves 211, and the light emitting parts 220 are electrically connected to the array substrate 100.

Forming the light emitting layer 200 on the array substrate 100 by using evaporation. The light emitting layer 200 includes the pixel definition structure 210, the plurality of light emitting parts 220, and a cathode 230. The cathode 230 is disposed in the placement trough 130 and on the array substrate 100. The pixel definition structure 210 is disposed on the array substrate 100 and on the cathode 230. The pixel definition structure 210 includes a plurality of grooves 211. The display panel 10 includes a display area 11 and a non-display area 12 surrounding the display area 11. The pixel definition structure 210 includes a first part 212 and a second part 213. The first part 212 is located at the display area 11. The second part 213 is located at the non-display area 12. The light emitting parts 220 are disposed in the grooves 211 and at the display area 11. The light emitting parts 220 are electrically connected to the array substrate 100.

40, forming a water and oxygen adsorption layer 300 on the light emitting layer 200, wherein the water and oxygen adsorption layer 300 includes a plurality of water and oxygen adsorption parts 310, the water and oxygen adsorption parts 310 are disposed on the pixel definition structure 210, and a surface of the water and oxygen adsorption parts 310 is convex.

A material of the water and oxygen adsorption layer 300 is printed on the light emitting layer 200, and is cured using ultraviolet light to form the water and oxygen adsorption layer 300. The water and oxygen adsorption layer 300 includes a plurality of water and oxygen adsorption parts 310. An upper surface of the water and oxygen adsorption parts 310 is convex. Specifically, a structure of the water and oxygen adsorption parts 310 is a hemispherical structure. A material of the water and oxygen adsorption layer 300 includes one or more of polyacrylate, polyvinyl alcohol, polyoxy alkane, polyurethane, acrylate, and casein. The water and oxygen adsorption parts 310 are disposed on the second part 213.

In another embodiment, the water and oxygen adsorption parts 310 are disposed on the first part 212.

In another embodiment, the water and oxygen adsorption parts 310 are disposed on the first part 212 as well as on the second part 213. A diameter of the water and oxygen adsorption parts 310 located on the first part 212 is less than that of the water and oxygen adsorption parts 310 located on the second part 213.

In another embodiment, the water and oxygen adsorption parts 310 are disposed at areas between adjacent columns and adjacent rows of grooves 211.

When the water and oxygen adsorption parts are disposed at the areas between adjacent columns and adjacent rows of grooves, because the areas between adjacent columns and adjacent rows of grooves are large, the water and oxygen adsorption parts do not easily fall into the grooves during the manufacturing processes, the water and oxygen adsorption parts can be prepared rapidly, production cycle is shortened, and production cost is decreased.

In another embodiment, the water and oxygen adsorption parts 310 are disposed not only at gaps of columns of the grooves 211, but also at gaps of rows of the grooves 211.

When water and oxygen adsorption parts are disposed at gaps of columns of grooves and at gaps of rows of the grooves, water and oxygen adsorption effect of a display panel is increased, and performance of the display panel is further ensured.

In another embodiment, after forming the water and oxygen adsorption layer 300, depositing a material of an encapsulation layer 400 to form the encapsulation layer 400 on the water and oxygen adsorption layer 300. The encapsulation layer 400 covers the pixel definition structure 210, the light emitting parts 220, and the water and oxygen adsorption parts 310.

The present application provides a display panel and a manufacturing method thereof. In the present application, a water and oxygen adsorption layer is disposed on a pixel definition structure, wherein the water and oxygen adsorption layer includes a plurality of water and oxygen adsorption parts that adsorb and lock water and oxygen entering an encapsulation layer, prevent the water and oxygen from eroding light emitting parts, and increase a lifetime of the display panel. Meanwhile, the water and oxygen adsorption parts are configured as convex, and light emitted by the light emitting parts will reflect at the convex surface, which changes an incidence angle of the light, and therefore the light penetrates the encapsulation layer and light-emitting efficiency is increased.

What is claimed is:

1. A display panel, comprising:
    an array substrate;
    a light emitting layer disposed on the array substrate, wherein the light emitting layer comprises a pixel definition structure, a plurality of light emitting parts, and a cathode, the cathode is disposed on the array substrate, the pixel definition structure comprises a plurality of grooves, the grooves penetrate through the pixel definition structure to expose the cathode, the light emitting parts are disposed in the grooves, and the light emitting parts are electrically connected to the array substrate; and
    a water and oxygen adsorption layer comprising a plurality of water and oxygen adsorption parts, wherein the water and oxygen adsorption parts are disposed on the pixel definition structure, and a surface of the water and oxygen adsorption parts is convex,
    wherein the pixel definition structure includes a first part and a second part, and a diameter of the water and oxygen adsorption parts located at a first part is less than a diameter of the water and oxygen adsorption parts located at a second part.

2. The display panel as claimed in claim 1, wherein the display panel includes a display area and a non-display area surrounding the display area, the first part is located at the display area, the second part is located at the non-display area, the light emitting parts are located at the display area, and the water and oxygen adsorption parts are located on the first part and on the second part.

3. The display panel as claimed in claim 1, wherein the display panel further comprises an encapsulation layer, and the encapsulation layer is disposed on the water and oxygen adsorption layer and covers the pixel definition structure, the light emitting parts, and the water and oxygen adsorbing parts.

4. The display panel as claimed in claim 1, wherein a material of the water and oxygen adsorption parts comprises one or more of polyacrylate, polyvinyl alcohol, polyoxy alkane, polyurethane, acrylate, and casein.

5. The display panel as claimed in claim 1, wherein a shape of the water and oxygen adsorption parts is hemispherical.

6. A display panel, comprising:
an array substrate;
a light emitting layer disposed on the array substrate, wherein the light emitting layer comprises a pixel definition structure and a plurality of light emitting parts, the pixel definition structure comprises a plurality of grooves, the light emitting parts are disposed in the grooves, and the light emitting parts are electrically connected to the array substrate; and
a water and oxygen adsorption layer comprising a plurality of water and oxygen adsorption parts, wherein the water and oxygen adsorption parts are disposed on the pixel definition structure, and a surface of the water and oxygen adsorption parts is convex,
wherein the pixel definition structure includes a first part and a second part, and a diameter of the water and oxygen adsorption parts located at a first part is less than a diameter of the water and oxygen adsorption parts located at a second part.

7. The display panel as claimed in claim 6, wherein the display panel includes a display area and a non-display area surrounding the display area, the first part is located at the display area, the second part is located at the non-display area, the light emitting parts are located at the display area, and the water and oxygen adsorption parts are located on the first part and on the second part.

8. The display panel as claimed in claim 6, wherein the display panel further comprises an encapsulation layer, and the encapsulation layer is disposed on the water and oxygen adsorption layer and covers the pixel definition structure, the light emitting parts, and the water and oxygen adsorption parts.

9. The display panel as claimed in claim 6, wherein a material of the water and oxygen adsorption parts comprises one or more of polyacrylate, polyvinyl alcohol, polyoxy alkane, polyurethane, acrylate, and casein.

10. The display panel as claimed in claim 6, wherein a shape of the water and oxygen adsorption parts is hemispherical.

11. A manufacturing method of a display panel, comprising:
providing an array substrate;
forming a light emitting layer on the array substrate, wherein the light emitting layer comprises a pixel definition structure and a plurality of light emitting parts, the pixel definition structure comprises a plurality of grooves, the light emitting parts are disposed in the grooves, and the light emitting parts are electrically connected to the array substrate; and
forming a water and oxygen adsorption layer on the light emitting layer, wherein the water and oxygen adsorption layer comprises a plurality of water and oxygen adsorption parts, the water and oxygen adsorption parts are disposed on the pixel definition structure, and a surface of the water and oxygen adsorption parts is convex, wherein the pixel definition structure includes a first part and a second part, and a diameter of the water and oxygen adsorption parts located at the first part is less than a diameter of the water and oxygen adsorption parts located at the second part.

12. The manufacturing method of the display panel as claimed in claim 11, wherein a shape of the water and oxygen adsorption parts is hemispherical.

13. The manufacturing method of the display panel as claimed in claim 11, wherein the display panel includes a display area and a non-display area surrounding the display area, the first part is located at the display area, the second part is located at the non-display area, the light emitting parts are located at the display area, and the water and oxygen adsorption parts are located on the first part and on the second part.

* * * * *